(12) United States Patent
Fang et al.

(10) Patent No.: US 7,786,514 B2
(45) Date of Patent: Aug. 31, 2010

(54) SWITCHING DEVICE FOR A PIXEL ELECTRODE

(75) Inventors: Kuo-Lung Fang, HsinChu County (TW); Wen-Ching Tsai, Yilan County (TW); Kuo-Yuan Tu, Miaoli County (TW); Han-Tu Lin, Taichung County (TW)

(73) Assignee: Au Optronics Corp., Hsinchu (TW)

( * ) Notice: Subject to any disclaimer, the term of this patent is extended or adjusted under 35 U.S.C. 154(b) by 306 days.

(21) Appl. No.: 11/964,174

(22) Filed: Dec. 26, 2007

(65) Prior Publication Data

US 2008/0099766 A1 May 1, 2008

Related U.S. Application Data

(62) Division of application No. 11/247,345, filed on Oct. 11, 2005, now Pat. No. 7,332,383.

(30) Foreign Application Priority Data

Jun. 20, 2005 (TW) .............................. 94120412 A

(51) Int. Cl.
*H01L 29/76* (2006.01)
*H01L 27/148* (2006.01)
*H01L 29/768* (2006.01)
*H01L 31/062* (2006.01)
*H01L 31/00* (2006.01)

(52) U.S. Cl. ................. 257/213; 257/291; 257/443; 257/223

(58) Field of Classification Search .............. 257/213, 257/2, 107, 114, 130, 155, 393, 444, 608, 257/223, 227, 291, 439, 443, 655
See application file for complete search history.

(56) References Cited

U.S. PATENT DOCUMENTS

| 6,562,668 B2 * | 5/2003 | Jang et al. ................. 438/158 |
| 6,936,844 B1 | 8/2005 | Yamazaki et al. |
| 2003/0207545 A1 * | 11/2003 | Yasukawa ................. 438/459 |
| 2005/0269639 A1 | 12/2005 | Yamazaki et al. |

FOREIGN PATENT DOCUMENTS

| CN | 1276622 | 12/2000 |
| EP | 1041641 | 4/2000 |

OTHER PUBLICATIONS

CN Office Action mailed Apr. 25, 2008.

* cited by examiner

*Primary Examiner*—Chuong Anh Luu
(74) *Attorney, Agent, or Firm*—Thomas, Kayden, Horstemeyer & Risley

(57) ABSTRACT

The invention discloses a switching device for a pixel electrode of display device. The switching device comprises a gate formed on a substrate; a gate-insulating layer formed on the gate; a first buffer layer formed between the substrate and the gate and/or between the gate and the gate-insulating layer, wherein the first buffer layer comprises $TaSi_x$, $TaSi_xN_y$, $TiSi_x$, $TiSi_xN_y$, $WSi_x$, $WSi_xN_y$, or $WC_xN_y$; a semiconductor layer formed on a portion of the gate-insulating layer; and a source and a drain formed on a portion of the semiconductor layer.

12 Claims, 8 Drawing Sheets

SWITCHING DEVICE FOR A PIXEL ELECTRODE

CROSS REFERENCE TO RELATED APPLICATIONS

This application is a divisional application of U.S. patent application Ser. No. 11/247,345, filed on Oct. 11, 2005 and entitled "SWITCHING DEVICE FOR A PIXEL ELECTRODE AND METHODS FOR FABRICATING THE SAME", now U.S. Pat. No. 7,332,383, granted.

BACKGROUND

The invention relates to a display device, and more particularly to a switching device of a pixel electrode and methods for fabricating the same.

Bottom-gate type thin film transistors (TFTs) are widely used for thin film transistor liquid crystal displays (TFT-LCDs). FIG. 1 is a sectional view of a conventional bottom-gate type TFT structure 100. The TFT structure 100 typically comprises a glass substrate 110, a gate 120, a gate-insulating layer 130, a channel layer 140, an ohmic contact layer 150, a source 160 and a drain 170.

As the size of TFT-LCD panels increases, metals having low resistance are required. For example, gate lines employ low resistance metals such as Cu and Cu alloy in order to improve operation of the TFT-LCD. However, Cu has unstable properties such as poor adhesion with the glass substrate. The poor adhesion may cause peeling. Cu also has a tendency to diffuse into a gate-insulating film (such as silicon-oxide film), affecting the quality of the TFT device. Moreover, Cu is vulnerable to deformation. Specifically, in plasma (such as plasma enhanced chemical vapor deposition, PECVD) deposition, characteristic degradation such as roughness and resistance to Cu are increased due to Cu reacting with the gas used.

U.S. Pat. No. 6,562,668 to Jang et al., the entirety of which is hereby incorporated by reference, discloses a method of forming a TFT. The method uses an aluminum oxide or aluminum nitride layer as an adhesion layer between a Cu gate and a glass substrate and a cap layer covering the Cu gate.

SUMMARY

Thin film transistors and fabrication methods thereof are provided. Problems such as diffusion of metal and poor adhesion can be solved according to the methods.

An embodiment of a fabrication method comprises forming a gate on a substrate, forming a gate-insulating layer on the gate, forming a semiconductor layer on a portion of the gate-insulating layer, forming a source and a drain on a portion of the semiconductor layer, and forming a pixel electrode electrically connected to the source/drain.

The method further comprises forming a first buffer layer between the substrate and the gate and/or between the gate and the gate-insulating layer. The first buffer layer, serving as an adhesion layer and/or a diffusion barrier layer, comprises $TaSi_x$, $TaSi_xN_y$, $TiSi_x$, $TiSi_xN_y$, $WSi_x$, $WSi_xN_y$, or $WC_xN_y$. The gate is covered by the first buffer layer.

Another embodiment of a method comprises forming a second buffer layer between the semiconductor layer and the source/drain. The second buffer layer, serving as a diffusion barrier layer, comprises $TaSi_x$, $TaSi_xN_y$, $TiSi_x$, $TiSi_xN_y$, $WSi_x$, $WSi_xN_y$, or $WC_xN_y$. The gate is covered by the first buffer layer.

With the described materials as an adhesion layer or a diffusion barrier layer, adhesion between the substrate and the gate is enhanced and diffusion of metal is reduced.

Thin film transistors (TFTs) of the invention can be bottom-gate or top-gate, serving as a switching device for a pixel electrode when the source/drain is electrically in contact with a pixel electrode. In addition, the TFT of the invention can be applied in display such as LCD.

DESCRIPTION OF THE DRAWINGS

The invention can be more fully understood by reading the subsequent detailed description in conjunction with the examples and references made to the accompanying drawings.

DETAILED DESCRIPTION

First Embodiment

An exemplary process for fabricating a first embodiment of TFT of the invention is shown in FIGS. 2A-2D.

Figure 1:
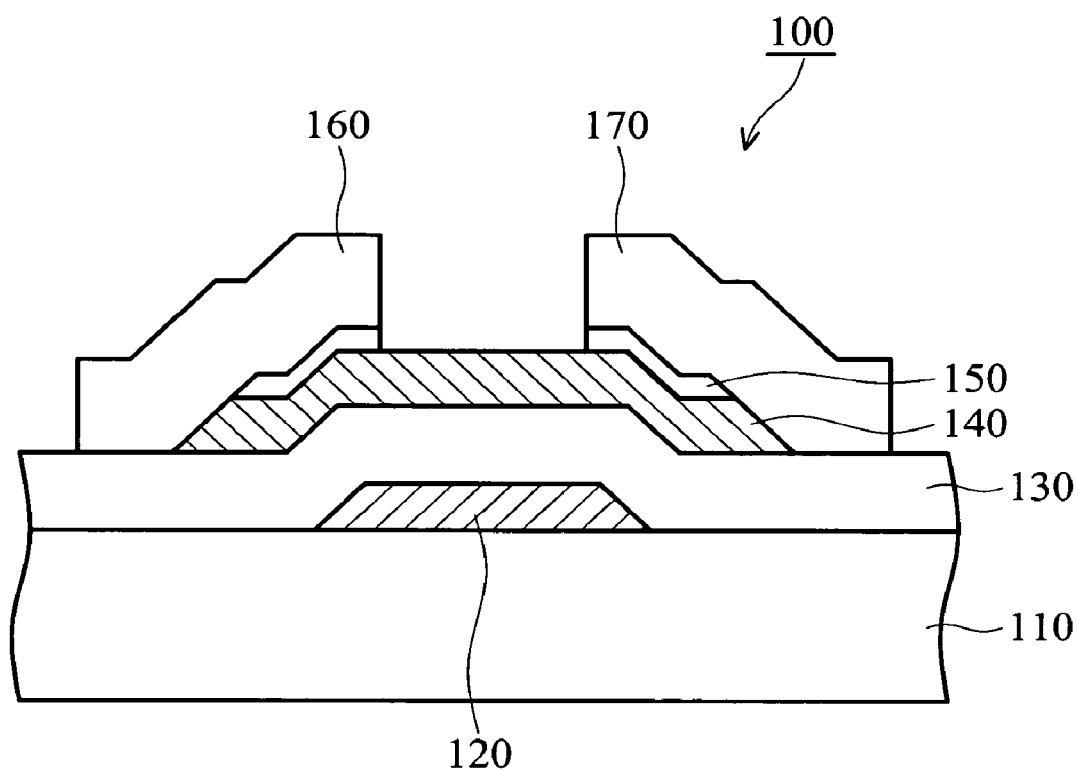
FIG. 1 is a sectional view of a conventional TFT structure.
Figure 2A:
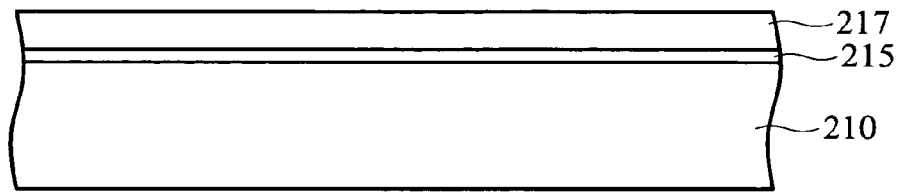
FIGS. 2A to 2D are sectional views of an exemplary process for fabricating a first embodiment of a TFT structure of the present invention.

In FIG. 2A, a material layer 215 is formed on a substrate 210, for example, by sputtering. The substrate 210 may be a glass substrate or a plastic substrate. The material layer 215 comprises $TaSi_x$, $TaSi_xN_y$, $TiSi_x$, $TiSi_xN_y$, $WSi_x$, or $WSi_xN_y$, at a thickness substantially about 5 nm to 200 nm. In other embodiments, the material layer 215 can be formed by atomic-layer deposition (ALD). The material layer 215 may be $WC_xN_y$, at a thickness substantially about 5 nm to 200 nm.

A metal layer 217 is then formed on the material layer 215, for example, by chemical vapor deposition (CVD), electro-chemical plating (ECP), or sputtering.

Figure 2B:
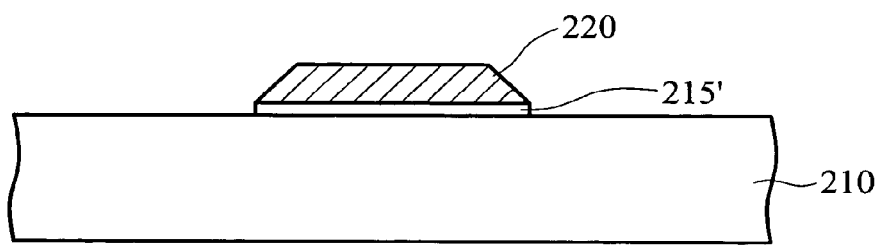

In FIG. 2B, an adhesion layer 215' and a gate 220 are formed on the substrate 210 after photolithography and etching in sequence. The gate 220 comprises Cu, Al, Ag, or metal alloy thereof, at a thickness substantially about 100 nm to 500 nm.

Figure 2C:
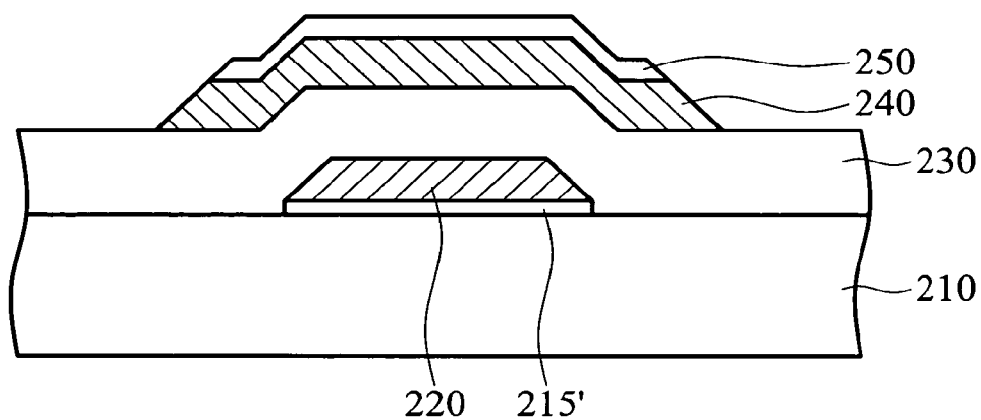

In FIG. 2C, a gate-insulating layer 230 is conformally formed on the gate 220 prior to formation of a semiconductor layer (not shown) on the gate-insulating layer 230. Methods of formation of the gate-insulating layer 230 comprise CVD, plasma-enhanced CVD (PECVD), physical vapor deposition (PVD), or sputtering. The gate-insulating layer 230 comprises silicon oxide, silicon nitride, silicon oxynitride, tantalum oxide, aluminum oxide, a compound containing Si, O and C, a compound containing Si, O, C and H, a compound containing Si and C, a compound containing C and F, a substantially starburst-shaped compound containing center of C, or a substantially starburst-shaped compound containing center of Si. The thickness of gate-insulating layer 230 is substantially about 50 nm to 500 nm.

The semiconductor layer comprising a channel layer 240 and an ohmic contact layer 250 is defined on a portion of the gate-insulating layer 230 by deposition and patterning. The channel layer 240 can be an undoped amorphous silicon layer formed by CVD, at a thickness substantially about 50 nm to 200 nm. The ohmic contact layer 250 can be an impurity-added silicon layer formed by CVD, at a thickness substantially about 10 nm to 100 nm. The impurity can be n type dopant (for example, P or As) or p type dopant (for example, B).

Figure 2D:
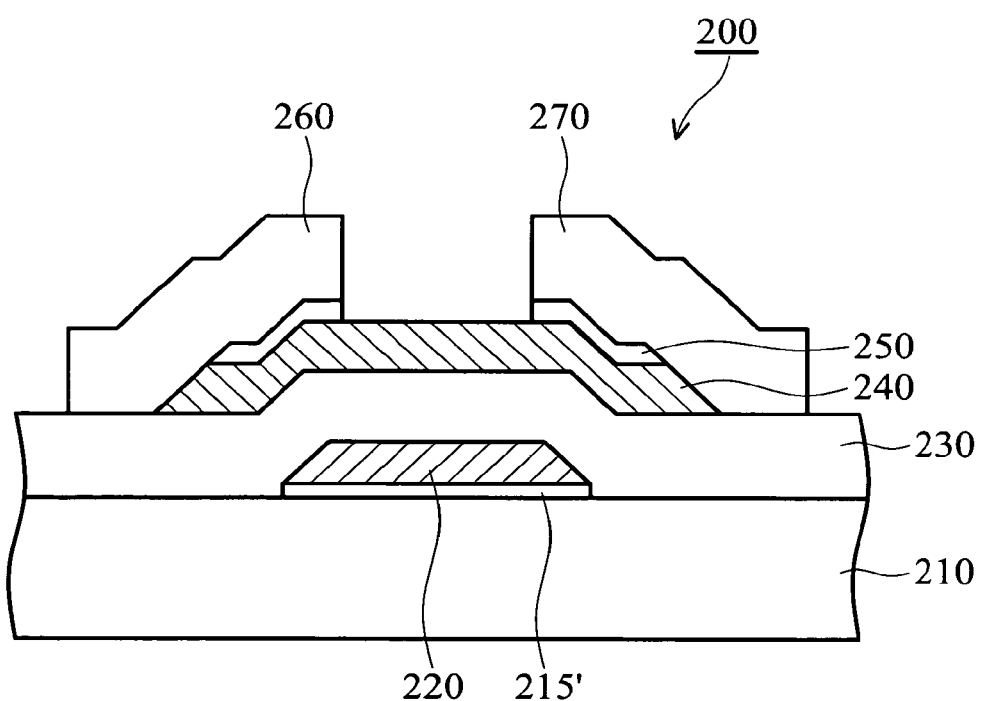

In FIG. 2D, a metal layer (not shown) is formed on the ohmic contact layer 250, for example, by CVD, electrochemical plating (ECP), or sputter deposition. The source/drain 260/270 of metal is formed on the semiconductor layer by selectively etching through the metal layer and ohmic contact layer 250, exposing a portion of the surface of the channel layer 240. A pixel electrode (not shown) is formed, electrically connecting to the source 260 or the drain 270. As a result, a thin film transistor 200, serving as a switching device, is obtained. The source/drain 260/270 comprises Cu, Ag, Al, or metal alloy thereof. The thickness of the source/drain 260/270 is substantially about 100 nm to 500 nm.

Second Embodiment

An exemplary process for fabricating a second embodiment of TFT of the invention is shown in FIGS. 3A-3D.

Figure 3A:
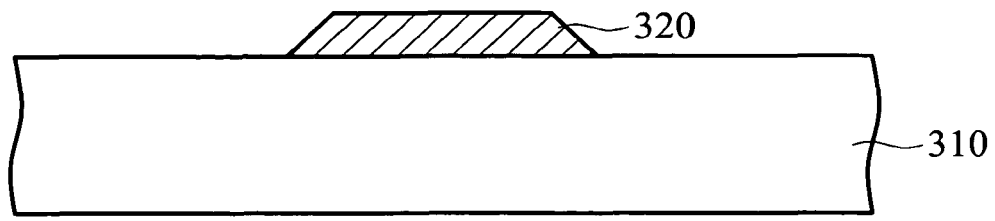
FIGS. 3A to 3D are sectional views of an exemplary process for fabricating a second embodiment of a TFT structure of the present invention.

In FIG. 3A, a metal layer (not shown) is formed on the substrate 310, for example, by CVD, electrochemical plating (ECP), or sputtering. A gate 320 is formed on the substrate 310 after photolithography and etching in sequence. The substrate 310 comprises a glass substrate or a plastic substrate. The gate 320 comprises Cu, Ag, Al, or metal alloy thereof. The thickness of the gate 320 is substantially about 100 nm to 500 nm.

Figure 3B:
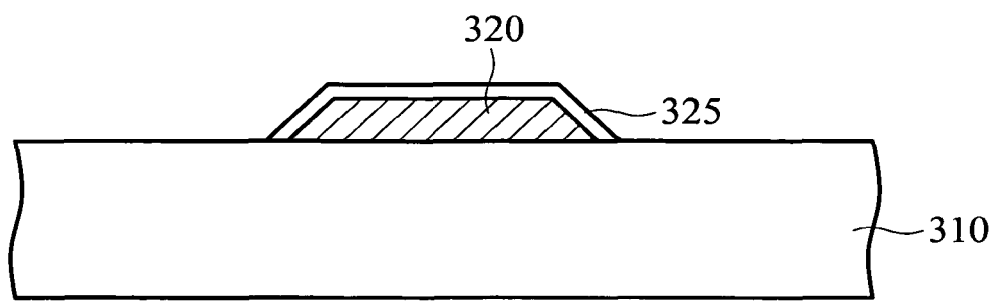

In FIG. 3B, a material layer 325 is formed on the gate 320, for example, by sputtering. The material layer 325 comprises $TaSi_x$, $TaSi_xN_y$, $TiSi_x$, $TiSi_xN_y$, $WSi_x$, or $WSi_xN_y$, at a thickness substantially about 5 nm to 200 nm. In other embodiments, the material layer 325 can be formed on the substrate 310 by atomic-layer deposition (ALD). The material layer 325 may be $WC_xN_y$, at a thickness thereof is substantially about 5 nm to 200 nm.

Figure 3C:
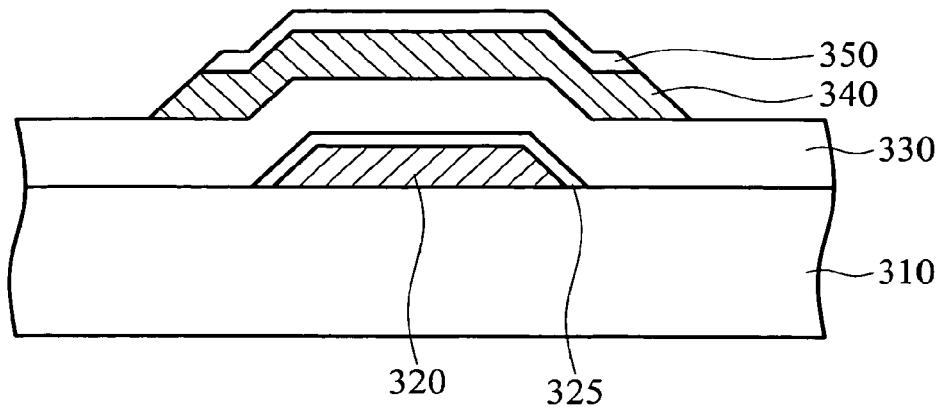

In FIG. 3C, a gate-insulating layer 330 is conformally formed on the material layer 325 prior to formation of a semiconductor layer (not shown) on the gate-insulating layer 330. Methods of formation of the gate-insulating layer 330 comprise CVD, plasma-enhanced CVD (PECVD), physical vapor deposition (PVD), or sputtering. The gate-insulating layer 330 comprises silicon oxide, silicon nitride, silicon oxynitride, tantalum oxide, aluminum oxide, a compound containing Si, O and C, a compound containing Si, O, C and H, a compound containing Si and C, a compound containing C and F, a substantially starburst-shaped compound containing center of C, or a substantially starburst-shaped compound containing center of Si. The thickness of gate-insulating layer 330 is substantially about 50 nm to 500 nm.

The semiconductor layer comprising a channel layer 340 and an ohmic contact layer 350 is defined on a portion of the gate-insulating layer 330 by deposition and patterning. The channel layer 340 can be an undoped amorphous silicon layer formed by CVD, at a thickness substantially about 50 nm to 200 nm. The ohmic contact layer 350 can be an impurity-added silicon layer formed by CVD, at a thickness substantially about 10 nm to 100 nm. The impurity can be n type dopant (for example, P or As) or p type dopant (for example, B).

Figure 3D:
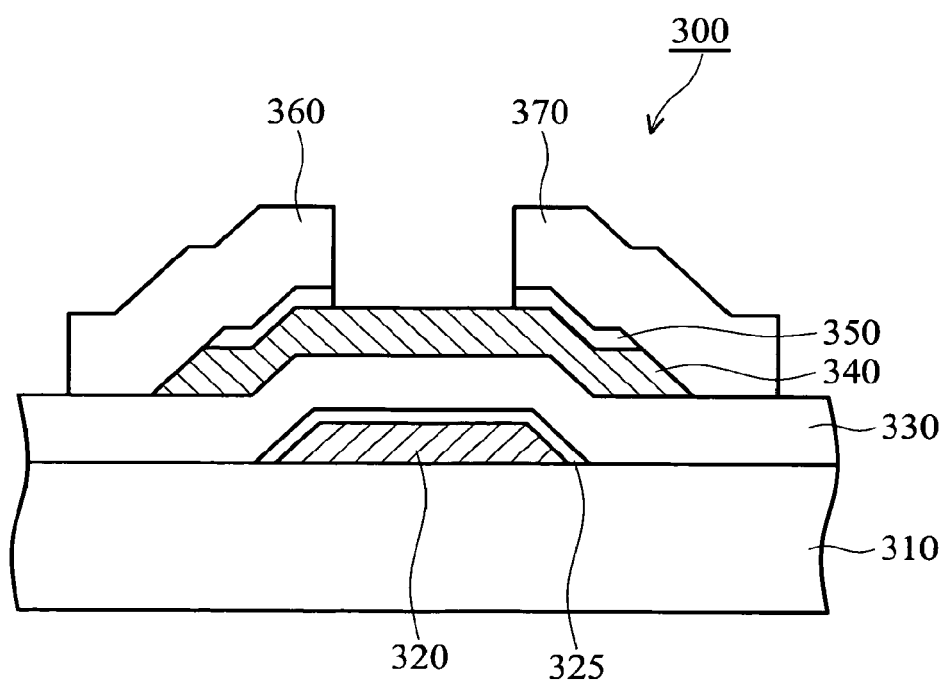

In FIG. 3D, a metal layer (not shown) is formed on the ohmic contact layer 350, for example, by CVD, electrochemical plating (ECP), or sputtering. The source/drain 360/370 of metal are formed on the semiconductor layer by selectively etching through the metal layer and ohmic contact layer 350, exposing a portion of surface of the channel layer 340. A pixel electrode (not shown) is formed, electrically connected to the source 360 or the drain 370. As a result, a thin film transistor 300, serving as a switching device, is obtained. The source/drain 360/370 comprise Cu, Ag, Al, or metal alloy thereof. The thickness of the source/drain 360/370 is substantially about 100 nm to 500 nm.

Third Embodiment

An exemplary process for fabricating a third embodiment of TFTs of the invention is shown in FIGS. 4A-4E.

Figure 4A:
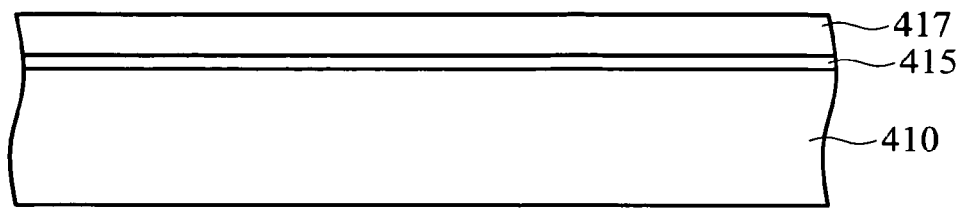
FIGS. 4A to 4E are sectional views of an exemplary process for fabricating a third embodiment of a TFT structure of the present invention.

In FIG. 4A, a material layer 415 is formed on a substrate 410, for example, by sputter deposition. The substrate 410 may be a glass substrate or a plastic substrate. The material layer 415 comprises $TaSi_x$, $TaSi_xN_y$, $TiSi_x$, $TiSi_xN_y$, $WSi_x$, or $WSi_xN_y$, at a thickness substantially about 5 nm to 200 nm. In other embodiments, the material layer 415 can be formed by atomic-layer deposition (ALD). The material layer 415 may be $WC_xN_y$, at a thickness substantially about 5 nm to 200 nm.

A metal layer 417 is then formed on the material layer 415, for example, by chemical vapor deposition (CVD), electrochemical plating (ECP), or sputtering.

Figure 4B:
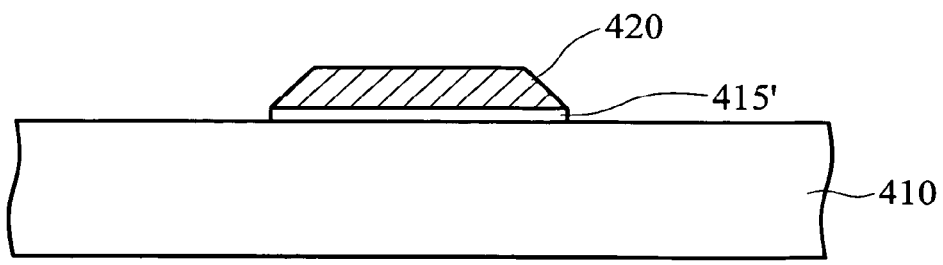

In FIG. 4B, an adhesion layer 415' and a gate 420 are formed on the substrate 410 after photolithography and etching in sequence. The gate 420 comprises Cu, Al, Ag, or metal alloy thereof, at a thickness substantially about 100 nm to 500 nm.

Figure 4C:
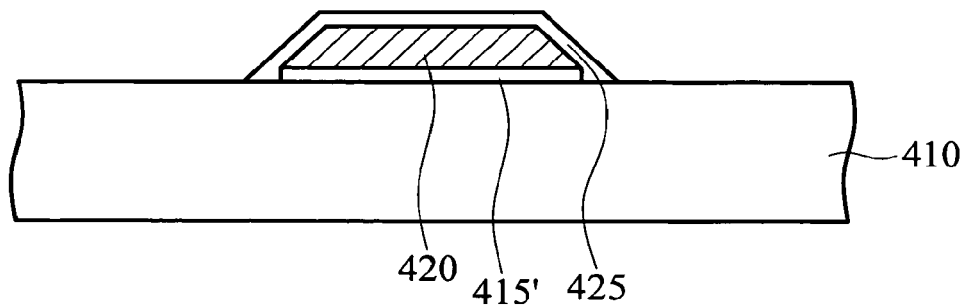

In FIG. 4C, a material layer 425 is conformally formed on the gate 420. The material layer 425 comprises $TaSi_x$, $TaSi_xN_y$, $TiSi_x$, $TiSi_xN_y$, $WSi_x$, or $WSi_xN_y$, at a thickness substantially about 5 nm to 200 nm. In other embodiments, the material layer 425 can be formed by atomic-layer deposition (ALD). The material layer 215 may be $WC_xN_y$, at a thickness substantially about 5 nm to 200 nm.

Figure 4D:
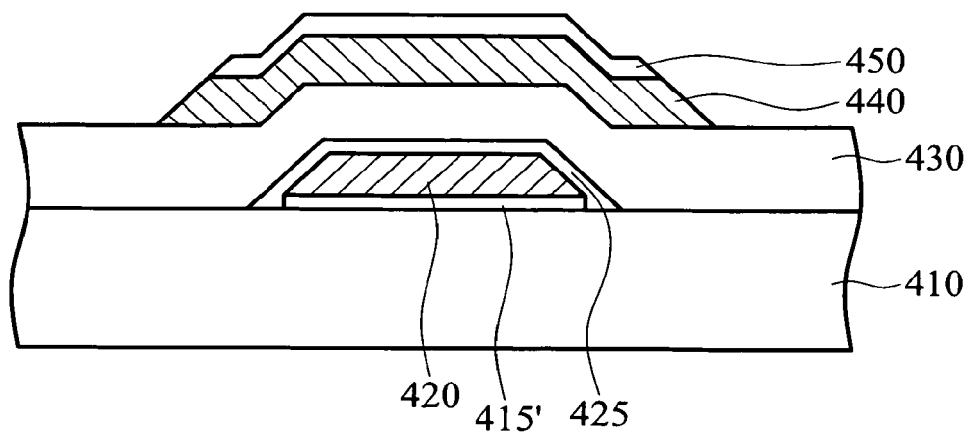

In FIG. 4D, a gate-insulating layer 430 is conformally formed on the material layer 425 prior to formation of a semiconductor layer (not shown) on the gate-insulating layer 430. Methods of formation of the gate-insulating layer 430 comprise CVD, plasma-enhanced CVD (PECVD), physical vapor deposition (PVD), or sputtering. The gate-insulating layer 430 comprises silicon oxide, silicon nitride, silicon oxynitride, tantalum oxide, aluminum oxide, a compound containing Si, 0 and C, a compound containing Si, O, C and H, a compound containing Si and C, a compound containing C and F, a substantially starburst-shaped compound containing center of C, or a substantially starburst-shaped compound containing center of Si. The thickness of gate-insulating layer 430 is substantially about 50 nm to 500 nm.

The semiconductor layer comprising a channel layer 440 and an ohmic contact layer 450 is defined on a portion of the gate-insulating layer 430 by deposition and patterning. The channel layer 440 can be an undoped amorphous silicon layer formed by CVD, at a thickness substantially about 50 nm to 200 nm. The ohmic contact layer 450 can be an impurity-added silicon layer formed by CVD, at a thickness substantially about 10 nm to 100 nm. The impurity can be n type dopant (for example, P or As) or p type dopant (for example, B).

Figure 4E:
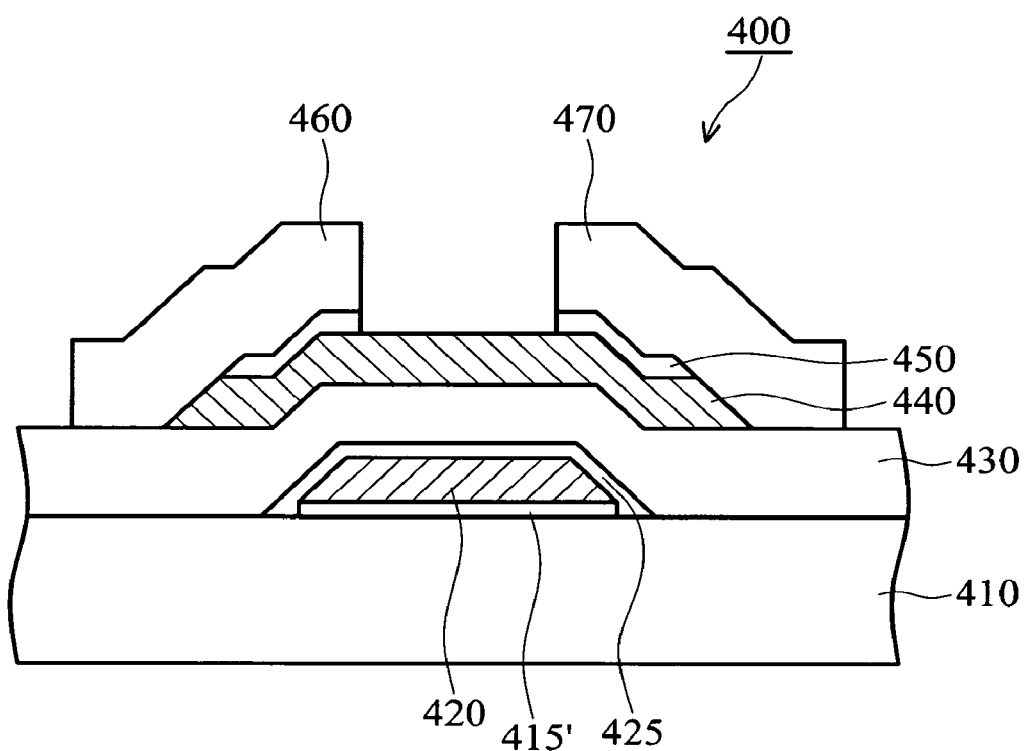

In FIG. 4E, a metal layer (not shown) is formed on the ohmic contact layer 450, for example, by CVD, electrochemical plating (ECP), or sputtering. The source/drain 460/470 of metal is formed on the semiconductor layer by selectively etching through the metal layer and ohmic contact layer 450, exposing a portion of surface of the channel layer 440. A pixel electrode (not shown) is formed, electrically connecting to the source 460 or the drain 470. As a result, a thin film transistor 400, serving as a switching device, is obtained. The source/drain 460/470 comprise Cu, Ag, Al, or metal alloy thereof. The thickness of the source/drain 460/470 is substantially about 100 nm to 500 nm.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A switching device of a pixel electrode for a display, comprising:
    an adhesion layer formed directly on a substrate, and the adhesion layer consisting essentially of TaSix, TaSixNy, TiSix, TiSixNy, WSix, WSixNy, and WCxNy;
    a gate directly formed on the adhesion layer;
    a gate-insulating layer formed on the gate;
    a first buffer layer formed between the gate and the gate-insulating layer, wherein the first buffer layer comprises TaSix, TaSixNy, TiSix, TiSixNy, WSix, WSixNy, or WCxNy;
    a semiconductor layer formed on a portion of the gate-insulating layer; and
    a source and a drain formed on a portion of the semiconductor layer.

2. The switching device of a pixel electrode according to claim 1, further comprising a pixel electrode electrically connected to the source or the drain.

3. The switching device of a pixel electrode according to claim 1, wherein the gate is covered by the first buffer layer.

4. The switching device of a pixel electrode according to claim 1, wherein the thickness of the first buffer layer is substantially about 5 nm to 200 nm.

5. The switching device of a pixel electrode according to claim 1, further comprising a second buffer layer disposed between the semiconductor layer and the source/drain.

6. The switching device of a pixel electrode according to claim 5, wherein the second buffer layer comprises TaSix, TaSixNy, TiSix, TiSixNy, WSix, WSixNy, or WCxNy.

7. The switching device of a pixel electrode according to claim 5, wherein the thickness of the second buffer layer is substantially about 5 nm to 200 nm.

8. The switching device of a pixel electrode according to claim 1, wherein the substrate comprises a glass substrate or a plastic substrate.

9. The switching device of a pixel electrode according to claim 1, wherein the gate comprises Cu, Ag, Al, or metal alloy thereof.

10. The switching device of a pixel electrode according to claim 1, wherein the gate-insulating layer comprises silicon oxide, silicon nitride, silicon oxynitride, tantalum oxide, aluminum oxide, a compound containing Si, O and C, a compound containing Si, O, C and H, a compound containing Si and C, a compound containing C and F, a substantially starburst-shaped compound containing center of C, or a substantially starburst-shaped compound containing center of Si.

11. The switching device of a pixel electrode according to claim 1, wherein the source/drain comprise Cu, Ag, Al, or metal alloy thereof.

12. A switching device of a pixel electrode for a display, comprising:
    an adhesion layer formed on a substrate, wherein the adhesion layer comprises TaSix, TaSixNy, TiSix, TiSixNy, WSix, WSixNy, or WCxNy;
    a gate formed on the adhesion layer;
    a gate-insulating layer formed on the gate;
    a first buffer layer formed between the gate and the gate-insulating layer, wherein the first buffer layer comprises TaSix, TaSixNy, TiSix, TiSixNy, WSix, WSixNy, or WCxNy;
    a semiconductor layer formed on a portion of the gate-insulating layer;
    a source and a drain formed on a portion of the semiconductor layer; and
    a second buffer layer disposed between the semiconductor layer and the source/drain, wherein the second buffer layer comprises TaSix, TaSixNy, TiSix, TiSixNy, WSix, WSixNy, or WCxNy.

\* \* \* \* \*